(12) United States Patent
Bolton, Jr. et al.

(10) Patent No.: US 7,184,487 B2
(45) Date of Patent: Feb. 27, 2007

(54) RECEIVER WITH CHOPPER STABILIZATION AND METHOD THEREOF

(75) Inventors: Jerry T. Bolton, Jr., Aventura, FL (US); Joseph P. Heck, Fort Lauderdale, FL (US)

(73) Assignee: Motorola, Inc., Schaumburg, IL (US)

( * ) Notice: Subject to any disclaimer, the term of this patent is extended or adjusted under 35 U.S.C. 154(b) by 49 days.

(21) Appl. No.: 11/019,750

(22) Filed: Dec. 21, 2004

(65) Prior Publication Data

US 2006/0133550 A1 Jun. 22, 2006

(51) Int. Cl.
*H04B 15/00* (2006.01)
(52) U.S. Cl. ............. 375/285; 375/346; 375/350; 455/295; 455/307; 455/323; 455/334; 329/320; 329/350; 329/353
(58) Field of Classification Search ............ 375/285, 375/316, 340, 346, 350; 455/190.1, 295, 455/296, 307, 313, 316, 317, 323, 334; 329/302, 329/306, 318, 320, 323, 324, 346, 349, 350, 329/353, 358
See application file for complete search history.

(56) References Cited

U.S. PATENT DOCUMENTS

| | | | |
|---|---|---|---|
| 6,351,506 B1 * | 2/2002 | Lewicki | 375/350 |
| 6,657,488 B1 * | 12/2003 | King et al. | 330/9 |
| 6,978,125 B2 * | 12/2005 | Lindell et al. | 455/183.1 |

OTHER PUBLICATIONS

Jussi Ryynanen, et al, "Direct Conversion Receiver For GSM900, DCS1800, PCS1900 and WCDMA", 2003, p. 942-945.

* cited by examiner

*Primary Examiner*—Dac V. Ha

(57) ABSTRACT

A receiver (202) has a down-conversion receiver (304) for transforming a signal (201) from a first operating frequency to a second operating frequency that is lower than the first operating frequency, and a receiver filter (308) with chopper stabilization for filtering unwanted portions of the signal (306) at the second operating frequency and for generating a final filtered signal (203) at the second operating frequency.

17 Claims, 6 Drawing Sheets

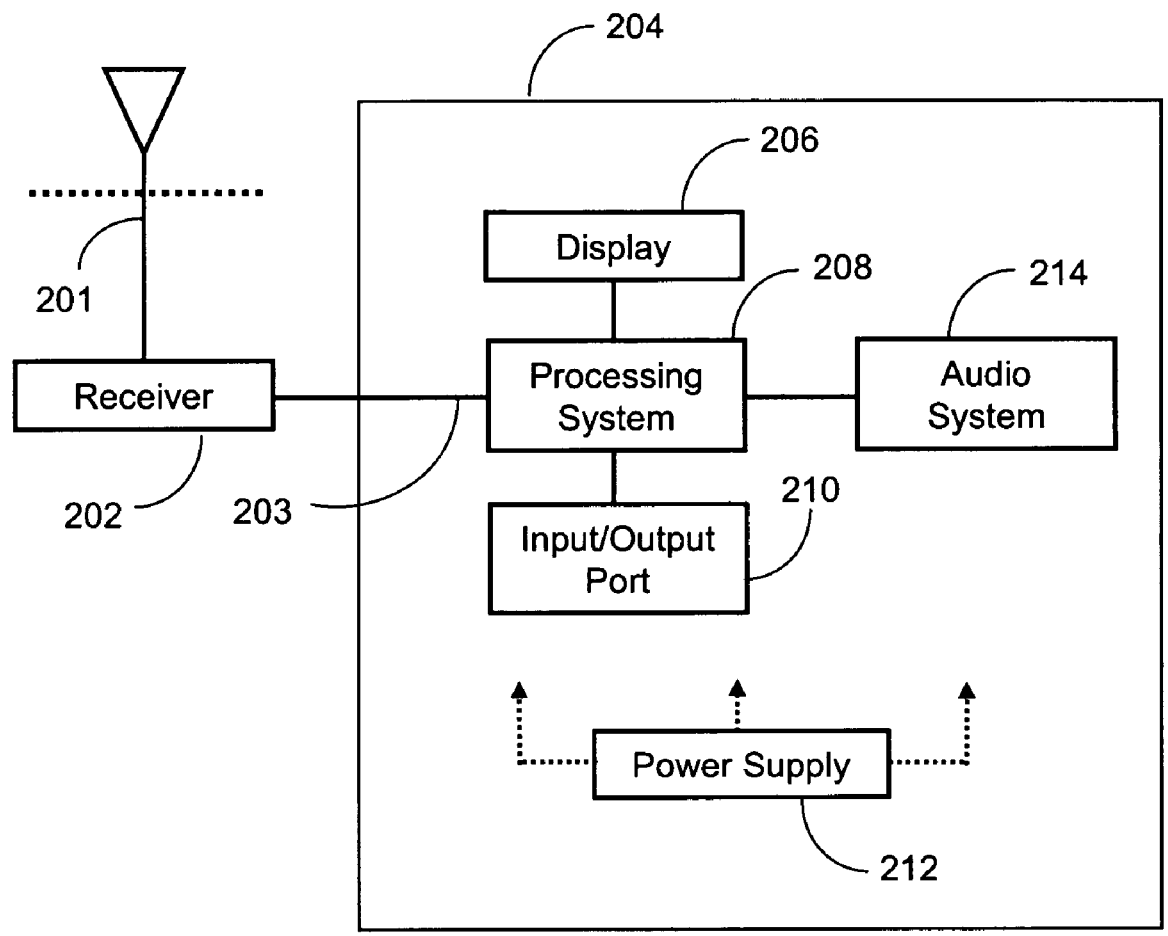
FIG. 1   200

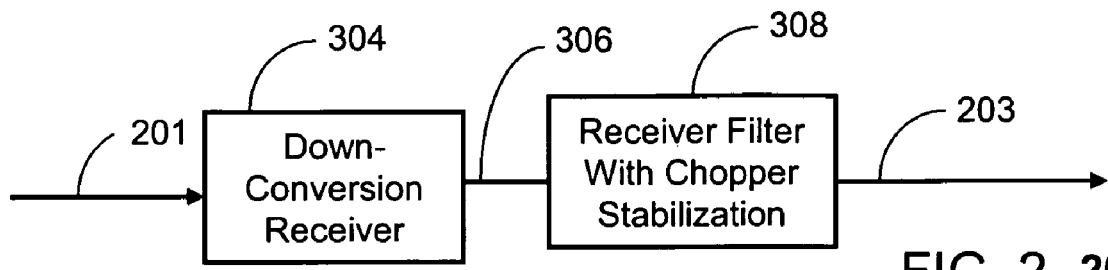
FIG. 2 202
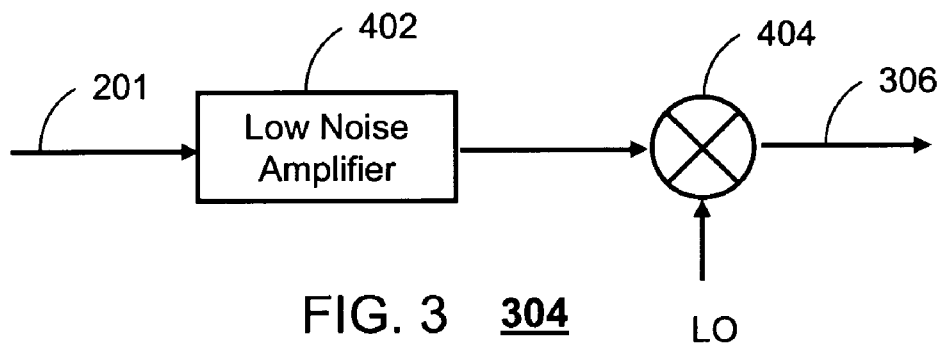
FIG. 3 304
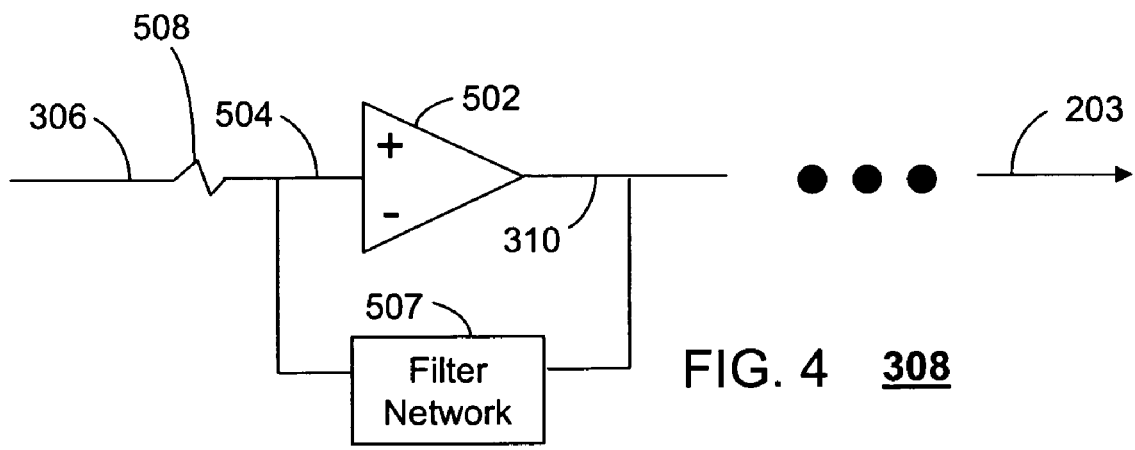
FIG. 4 308

RECEIVER WITH CHOPPER STABILIZATION AND METHOD THEREOF

FIELD OF THE INVENTION

This invention relates generally to receivers, and more particularly to chopper stabilization and methods thereof in receivers.

BACKGROUND OF THE INVENTION

Wireless communications generally involve transmitting a signal with voice and/or data messages carried therein at a carrier frequency (e.g., 2 Giga Hertz) from one communication device to another. The receiving device in turn demodulates the signal to a baseband signal (nearly zero Hertz) for processing and presenting the voice and/or data message to a recipient of the receiving device.

There are many demodulating techniques in the art. Among them are super heterodyne and direct conversion receivers. For each technique, the carrier frequency of the signal is translated to a baseband or nearly baseband signal. In the demodulation process, filtering and amplification techniques are used. These techniques, however, inject unwanted noise to the signal, which in turn causes distortions that can corrupt the message carried by the signal.

The embodiments of the invention below overcome the disadvantages of the aforementioned prior art.

SUMMARY OF THE INVENTION

Embodiments in accordance with the invention provide a receiver and method with chopper stabilization.

In a first embodiment of the present invention, a receiver has a down-conversion receiver for transforming a signal from a first operating frequency to a second operating frequency that is lower than the first operating frequency, and a receiver filter with chopper stabilization for filtering unwanted portions of the signal at the second operating frequency and for generating a final filtered signal at the second operating frequency.

In a second embodiment of the present invention, a selective call receiver has a receiver for generating from a signal at a first operating frequency a final filtered signal at a second operating frequency that is lower than the first operating frequency, and a processor for processing the final filtered signal. The receiver has a down-conversion receiver for transforming the signal from the first operating frequency to the second operating frequency, and a receiver filter with chopper stabilization for filtering unwanted portions of the signal at the second operating frequency and for generating the final filtered signal at the second operating frequency.

In a third embodiment of the present invention, a method is provided for transforming a signal at a first operating frequency. The method includes the steps of down-converting the signal from the first operating frequency to a second operating frequency that is lower than the first operating frequency, low-pass filtering with chopper stabilization unwanted portions of the signal operating at the second operating frequency, and generating a final filtered signal at the second operating frequency.

BRIEF DESCRIPTION OF THE DRAWINGS

FIG. 1 is a block diagram of a selective call receiver (SCR) in accordance with an embodiment of the present invention.

FIG. 2 is a block diagram of a receiver of the SCR of FIG. 1 in accordance with an embodiment of the present invention.

FIG. 3 is a block diagram of the down-conversion receiver of the receiver of FIG. 2 in accordance with an embodiment of the present invention.

FIG. 4 is a block diagram of a receiver filter of the receiver of FIG. 2 in accordance with an embodiment of the present invention.

DETAILED DESCRIPTION

Figure 5:
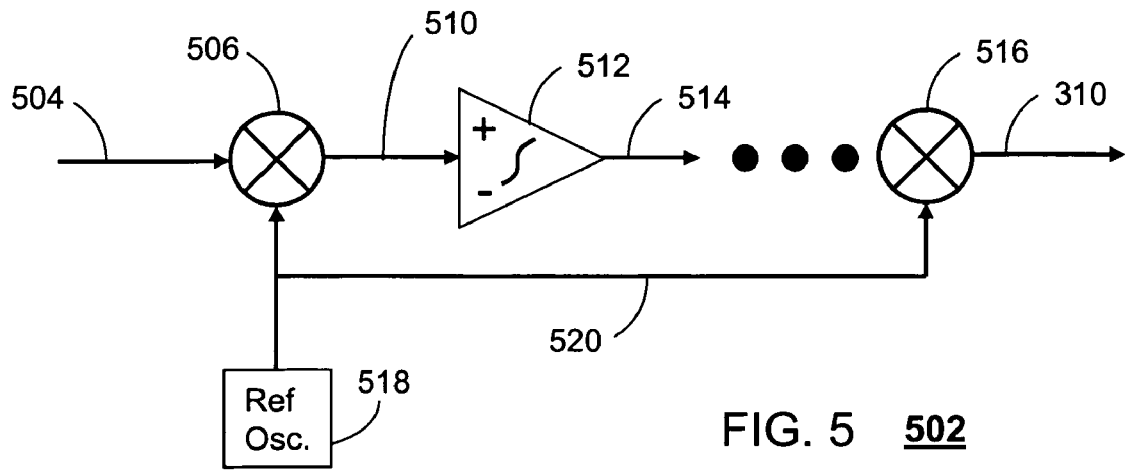
FIG. 5 is a block diagram of an operational amplifier (OP AMP) of the receiver filter of FIG. 4 in accordance with an embodiment of the present invention.

While the specification concludes with claims defining the features of embodiments of the invention that are regarded as novel, it is believed that the embodiments of the invention will be better understood from a consideration of the following description in conjunction with the figures, in which like reference numerals are carried forward.

FIG. 1 is a block diagram of a selective call receiver (SCR) 200 in accordance with an embodiment of the present invention. The SCR 200 can use conventional wireless or wire line means for communication as noted by the hashed line of FIG. 1. In the preceding case, a conventional antenna is coupled to a receiver 202. In the latter case, a conventional wire line such as, for example, a coax cable is coupled to the receiver 202 for receiving signals. In either case, the foregoing embodiments are interconnected with a conventional communication system, which provides messages to the SCR 200. With the addition of a conventional transmitter, the SCR 200 can also be configured to receive and transmit messages much like a cellular phone, two-way radio, wire line access point, desktop or laptop computer with communication capability, or other like communication device.

The SCR 200 comprises a receiver 202 and a processor 204. The processor 204 includes a processing system 208, a display 206, an input/output port 210, an audio system 214, and a power supply 212. The components 206–212 of the processor 204 employ conventional technology. The processing system 208 includes means for processing the signal 203 (e.g., a microprocessor and/or a digital signal processor—DSP). The display 206 provides means for displaying messages (e.g., a liquid crystal display). The input/output port 210 provides means for importing and exporting data (e.g., a keypad and/or a universal serial bus port—USB). The audio system 214 provides means for presenting audio signals to a user of the SCR 200. And lastly, the power supply 212 provides means to power all elements of the SCR 200 including the receiver 202.

In an alternative embodiment, the processor 204 includes a subset of the foregoing element such as, for example, the processing system 206 and power supply 210. Moreover, the SCR 200 can be mobile or immobile depending on the intended application without deviating from the scope and spirit of the claimed invention.

The signals 201 and 203 include one or more messages transmitted by the conventional communication system which conform to conventional communication protocols such as, for example, CDMA (Code Division Multiple Access), TDMA (Time Division Multiple Access), GSM (Global System for Mobile communications), IEEE 802.11b, or other like communication protocols.

FIG. 2 is a block diagram of the receiver 202 of the SCR 200 in accordance with an embodiment of the present invention. The receiver 202 comprises a down-conversion receiver 304 and a receiver filter 308 with chopper stabilization. The down-conversion receiver 204 transforms the signal 201 from the first operating frequency to a second operating frequency that is lower than the first operating frequency. The receiver filter 308 filters unwanted portions of the signal 306 at the second operating frequency and generates the final filtered signal 203 at the second operating frequency.

The first operating frequency is typically at a carrier frequency in the 100 Mega Hertz to several Giga Hertz. The second operating frequency can be much lower than the first operating frequency and can range, for example, from a low intermediate frequency (e.g., at or below the bandwidth of the desired signal) to nearly zero Hertz (commonly referred to as the baseband frequency) of the unmodulated signal. It would be obvious to one of ordinary skill in the art that the first and second operating frequencies can operate outside the range of frequencies mentioned above while remaining within the scope and spirit of the claims described herein.

A block diagram of the down-conversion receiver 304 is illustrated in FIG. 3 in accordance with an embodiment of the present invention. The down-conversion receiver 304 utilizes conventional elements such as a low noise amplifier 402 and a mixer 402 coupled thereto. The mixer 404 is coupled to a local oscillator (LO) at or near the first operating frequency. The combination of the mixer 404 and the low noise amplifier 402 generates the signal 306 at the second operating frequency having an amplitude greater than the signal 201 as a result of processing by the low noise amplifier 402. The conventional components 402–404 of the down-conversion receiver 304 are well known in the art. A preferred, but not limiting, topology of the down-conversion receiver 304 of the present invention is a direct conversion receiver such as a low IF or zero IF receiver.

FIG. 4 illustrates a block diagram of the receiver filter 308 in accordance with an embodiment of the present invention. The block diagram depicts an $n^{th}$ pole LPF filter structure comprising at least one stage of an operational amplifier (OP AMP) 502 incorporating chopper stabilization coupled to a corresponding low-pass filter (LPF) network.

The OP AMP 502 preferably has differential inputs 504 coupled to the signal 306 at the second operating frequency, which is also differential. The differential signal 306 is generated by the down-conversion receiver 304 utilizing conventional means. Differential signals provide the added benefit of noise immunity and cancellation of even-order frequency distortion harmonics. It would be appreciated by one of ordinary skill in the art that non-differential signals could be used as an alternative design without changing the scope and spirit of the claims described herein.

The LPF network referred to above comprises a conventional filter network 507 coupled to a corresponding input resistor 508. These components are mirror imaged at each of the differential signals 306 and 504, respectively. Accordingly, there are two input resistors 508, and two conventional filter networks 507 the combination of which produce a single pole or an $n^{th}$ pole LPF structure depending on the filter network 507 utilized.

For example, to produce a single pole LPF structure, each filter network 507 comprises a resistor and capacitor connected as a parallel circuit. Each node of the parallel circuit is in turn connected to the input terminals 504 and output terminals 310 of the OP AMP 502, respectively. For higher order pole LPF structures, the filter network 507 comprises a more complex conventional resistor and capacitor network coupled to the input and output terminals 504 and 306 of the OP AMP 502, respectively. In an alternative embodiment, an $n^{th}$ pole LPF structure can be produced by repeating the foregoing LPF structure in as many single pole or multi-pole stages as may be desired to produce and overall $n^{th}$ pole LPF structure. Such a multi-stage LPF structure is represented by the three sequential dots in FIG. 4.

In either a multi-stage or single-stage $n^{th}$ pole LPF structure, the gain of each OP AMP 502 is the ratio of the input resistance over the resistance of the filter network 507, while the 3 dB filtering bandwidth is represented by the time constant of the filter network 507. Moreover, the OP AMP 502 generates from the signal 306 at the second operating frequency an OP AMP signal 310 at the second operating frequency that is filtered by the corresponding LPF network (described above) to generate the final filtered signal 203.

Application of chopper stabilization techniques to operational amplifiers is well known in the art. The reader is directed to the following materials, which are herein incorporated by reference, for further information on the implementation of this technique: P. Allen and D. Holdberg, *CMOS Analog Circuit Design*. Orlando, Fla.: Harcourt Brace Jovanovich, 1987; and C. Enz, G. Temes, "Circuit Techniques for Reducing the Effects of Op-Amp Imperfections: Autozeroing, Correlated Double Sampling, and Chopper Stabilization", *Proceedings of the IEEE*, vol-84, November 1996.

FIG. 5 depicts a block diagram of a first embodiment of the OP AMP 502 in accordance with the present invention. In this embodiment, the OP AMP 502 comprises a reference oscillator 518, an up-conversion mixer 506, an amplifier 512 having at least one stage (depicted by the sequential dots), and a down-conversion mixer 516. For consistency with the above discussions, all elements 506, 512, 516 and 518 of the OP AMP 502 utilize differential signals.

Figure 6:
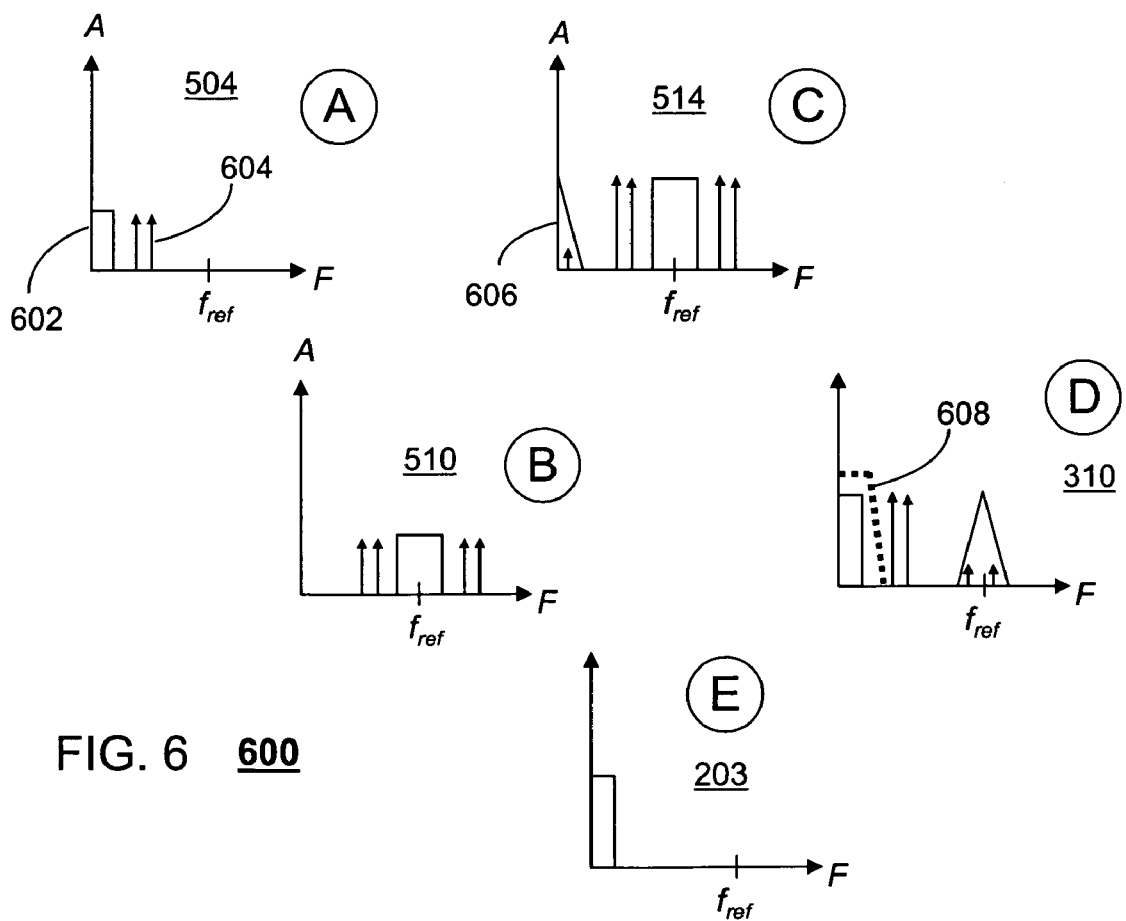
FIG. 6 is a spectral response of the embodiment of FIG. 5 in accordance with the present invention.

FIG. 6 provides a spectral representation of the receiver filter 308 according to the embodiment of FIGS. 4 and 5. The spectral response at each node of the OP AMP 502 are illustrated sequentially by the letterings A through E and corresponding node signals 504, 510, 514, 310 and 203.

At the input of the OP AMP 502 (spectral image A), the differential signal 504 includes an ideal signal 602, which carries information relating to the message transmitted to the SCR 200. Adjacent to the ideal signal 602 are interferer signals 604. These signals may be generated by, for example, cellular sites near the cell site where the SCR 200 is located. The spectral shape of the ideal signal 602 and interferers 604 are illustrative and can take other forms commensurate with the application.

Utilizing conventional mixer technology, the up-conversion mixer 506 coupled to the reference oscillator 518 transforms the signal 504 at the second operating frequency to a third operating frequency that is greater than the second operating frequency. Where the second operating frequency is at or near baseband, the third operating frequency can be, for example, 20 MHz. It would be obvious to one of ordinary skill in the art that a wide range of frequencies can be chosen for the third operating frequency.

The up-conversion process spectrally moves the differential signal 504 to a reference frequency ($f_{ref}$) as shown in spectral image B of FIG. 6. At this frequency, the ideal signal 602 and interferers 604 produce a spectral mirror image centered at $f_{ref}$. Utilizing convention amplifier technology, the amplifier 512 generates from the signal 510 at the third operating frequency an amplified signal 514 at the third operating frequency as illustrated in spectral image C. As evident from this illustration, the ideal and interferer signals 602 and 604 have a higher amplitude that the original signal 510.

Amplifiers designed in any technology have certain non-ideal characteristics that have the effect of injecting impairments 606 into the amplified signal 514 of each amplifier stage 512 (represented by the "S" symbol). These impairments 606 of the amplifier 512 can comprise well-known components such as a DC offset, flicker noise, and $2^{nd}$ order distortion. The DC offset occurs at zero Hertz as shown in image C. Flicker noise is the attenuating triangular spectral shape also shown in image C. The $2^{nd}$ order distortion is represented by the small arrow in the half triangle. This latter distortion is directly related to the difference in frequency between the interferers 604.

On account of the up-conversion process, the unwanted spectral noise 606 is spectrally separated from the ideal signal 602 at the third operating frequency thereby avoiding distortions between them. Conventional OP AMPs that do not utilize the up-conversion mixer 506 of the present invention would have blended the spectral noise 606 with the ideal signal 602 thereby distorting and perhaps corrupting messages included therein.

The down-conversion mixer 516, which is also coupled to the reference oscillator 518, transforms the amplified signal 514 from the third operating frequency to an OP AMP signal 310 at the second operating frequency. The frequency transformation is depicted by spectral image D of FIG. 6. Spectral image D shows how the spectral noise 606 of image C is moved up in frequency to $f_{ref}$ with a spectral mirror image completing the triangular spectral shape, while the ideal and interferer signals 602 and 604 are moved down in frequency to the second operating frequency, which in this illustration, is at or near zero Hertz.

Spectral image D illustrates the effect of the LPF network coupled to the at least one stage OP AMP 502. The LPF network filters unwanted portions of the OP AMP signal 310 by allowing only the spectral signals within the LPF filter window 608, thereby eliminating the interferers and spectral noise signals 604 and 606. As a result, the output of the receiver filter 308 is the final filtered signal 203 comprising the ideal signal 602 with no distortions, or in the case where low order pole LPF networks are used, with minimal distortion.

Referring back to FIG. 5, the reference oscillator 518 can be represented by periodic clock signals such as a sinusoidal wave, square wave or other periodic clock signal. Although square wave clock signals are an adequate embodiment for the present invention, such signals can have the undesirable property of generating spectral energy at odd multiples of the fundamental frequency of the clock signal.

To remove these undesirable properties, the reference oscillator 518 can alternatively be a pseudo random clock signal. Such clock signals help to eliminate or spread the signal energy such that spurious responses can be avoided. This could be accomplished by randomizing the clock with dither and/or noise-shaping techniques, pseudo random noise generation techniques, or other means to create a clock signal that has a desirable spectral response.

Figure 7:
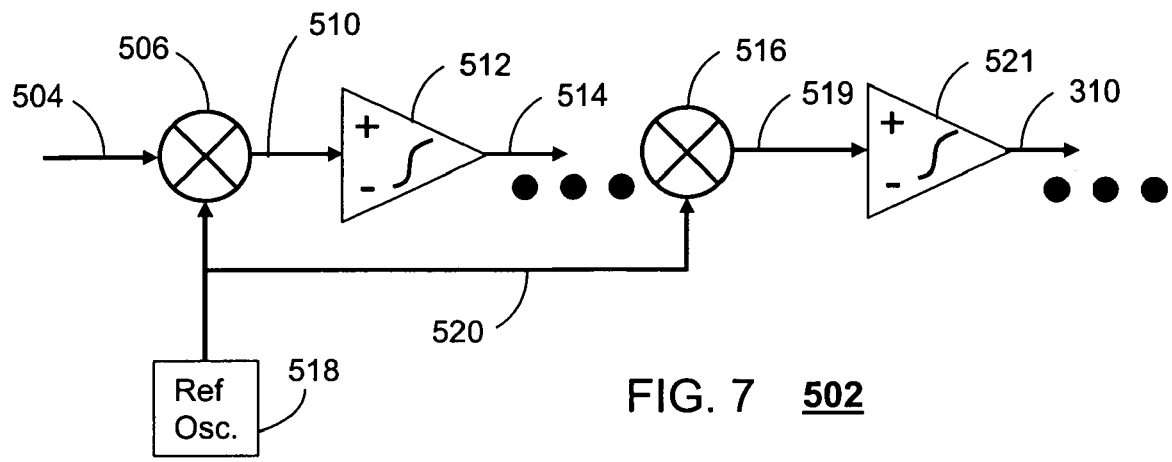
FIG. 7 is a block diagram of an alternative embodiment of the OP AMP of FIG. 5 in accordance with the present invention.

Referring to FIG. 7, an illustration of an alternative embodiment for the OP AMP 502 of FIG. 4 is shown. This embodiment adds to the embodiment of FIG. 5 a second amplifier 521 having at least one stage (as depicted by the sequential dots of FIG. 7) that processes the first amplified signal 519 at the second frequency generated from the combination of the first amplifier 512 (also having at least one stage as in FIG. 5) and the down-conversion mixer 516. The first amplified signal 519 has the same spectral response described in FIG. 6. However, in this embodiment, the first amplified signal 519 is further amplified by the second amplifier 521 to generate the OP AMP signal 310. Although the ideal signal 602 embedded in the OP AMP signal 310 has parasitic spectral noise 606 injected therein as was described in FIG. 6, the ideal signal 602 at this stage has a high enough signal to noise ratio that the noise component has negligible effect in distorting the ideal signal 602.

Although the reference oscillator 518 is shown as an integral component of the OP AMP 502 for the embodiments of FIGS. 5 and 7, it will be appreciated by one of ordinary skill in the art that the reference oscillator 518 can also be placed outside of the OP AMP 502 as an input thereto for sourcing the mixers contained in said embodiments without changing the functionality described above.

Figure 8:
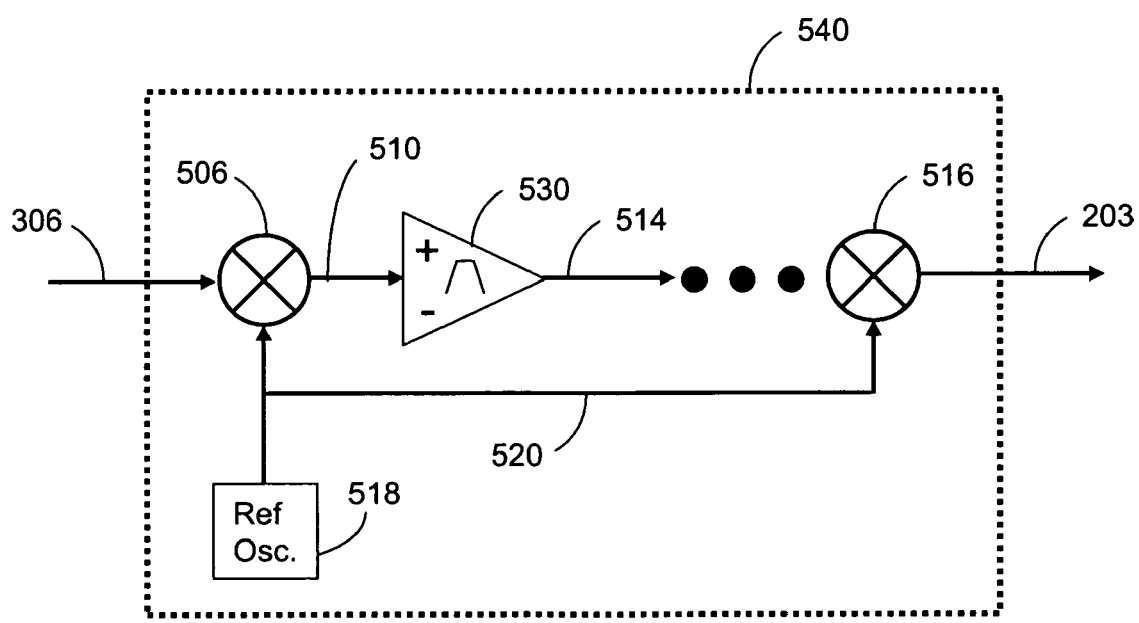
FIG. 8 is a block diagram of yet another embodiment of the receiver filter of FIG. 2 in accordance with the present invention.

FIG. 8 depicts yet another embodiment of the receiver filter 308 of FIG. 2 in accordance with the present invention. In this embodiment, the receiver filter 308 comprises a reference oscillator 518, an up-conversion mixer 506, a bandpass filter amplifier 530 having at least one stage (depicted by the sequential dots of FIG. 8), and a down-conversion mixer 516. The up-conversion mixer 506 performs the same operation described above for FIGS. 5 and 7; that is, to transform the signal 306 from the second operating frequency to a third operating frequency that is greater than the second operating frequency.

Utilizing conventional bandpass technology, the bandpass filter amplifier 530 filters unwanted portions of the signal 510 around the third operating frequency and generates an amplified filtered signal 514 at the third operating frequency. The down-conversion mixer 516 in turn transforms the amplified filtered signal 514 from the third operating frequency to the final filtered signal 203 at the second operating frequency.

Figure 9:
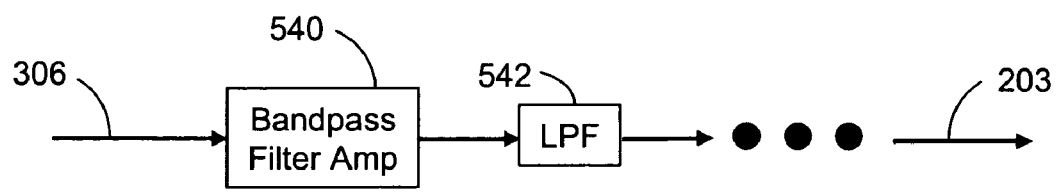
FIG. 9 is a block diagram of a supplemental embodiment of the receiver filter of FIG. 8 in accordance with the present invention.

FIG. 9 illustrates supplemental embodiment of the receiver filter of FIG. 8 in accordance with the present invention. This embodiment adds a LPF 542 having at least one stage (as depicted by the sequential dots of FIG. 9) to the embodiment 540 of FIG. 8. Utilizing conventional LPF technology, the LPF 542 provides and $n^{th}$ order LPF to eliminate spectral noise that the bandpass filter amplifier 530 was unable to remove and generates the final filtered.

Figure 10:
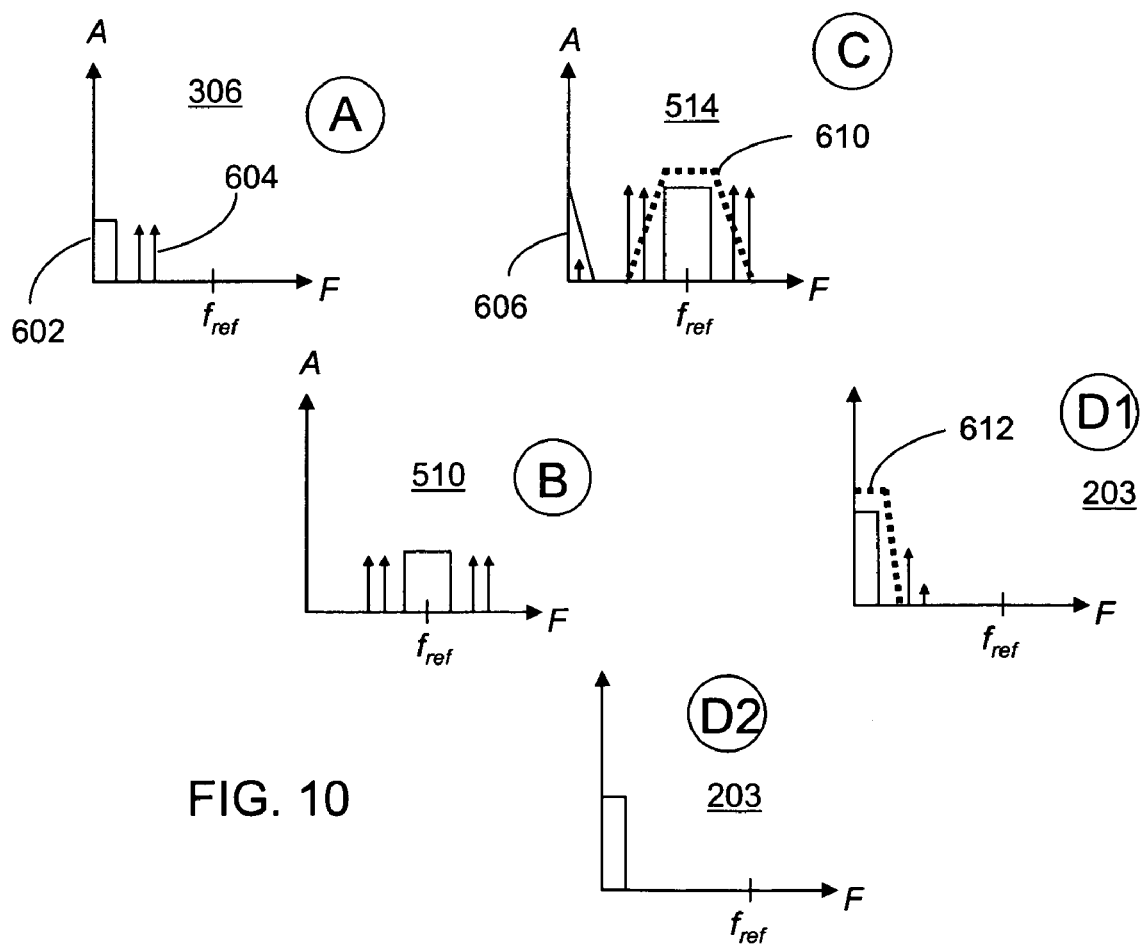
FIG. 10 is a spectral response of the embodiments of FIGS. 8 and 9, respectively, in accordance with the present invention.

FIG. 10 is a spectral response of the embodiments of FIGS. 8 and 9 in accordance with the present invention. Spectral images A and B are the same as described in FIG. 6. Spectral image C illustrates the effect of the at least one bandpass filter amplifier 530 on signal 510. From a last stage of the bandpass filter amplifier 530 the signal 510 at the third operating frequency ($f_{ref}$) and its components are amplified as shown in spectral image C. Contemporaneously, the bandpass filter amplifier 530 removes unwanted portions of the signal 510 according the bandpass filter window 610, thereby eliminating all or a portion of the interferers and the spectral noise signals 604 and 606 as shown in spectral image D1. The resulting signal is the final filtered signal 203.

Where a higher order bandpass filter is not used, a portion of the interferers 604 may remain as shown in image D1 due to the slow slopping edges of the bandpass filter window 610. In this instance, the embodiment of FIG. 9 provides the added benefit of eliminating a portion, or all, of this noise by way of the $n^{th}$ order LPF 542. The LPF 512 creates the LPF window 612 to eliminate the residual noise left by the embodiment 540 of FIG. 8, thereby generating the final filtered signal 203 as shown in spectral image D2.

Figure 11:
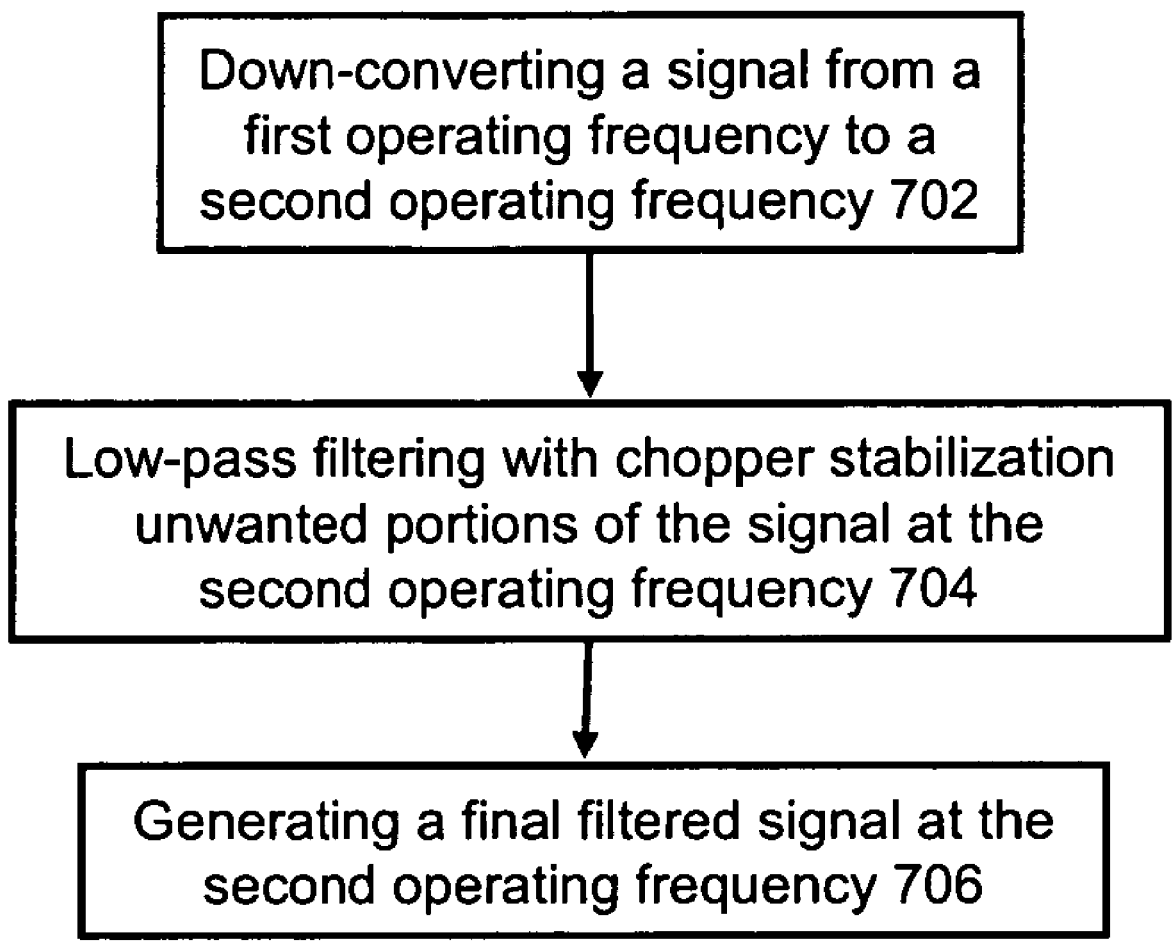
FIG. 11 is a flow chart depicting a method for transforming a signal at a first operating frequency in accordance with an embodiment of the present invention.

FIG. 11 shows a flow chart depicting a method 700 for transforming a signal at a first operating frequency in accordance with yet another embodiment of the present invention. The method 700 begins with step 702 where the signal 201 at the first operating frequency is down-converted to a second operating frequency that is lower than the first operating frequency. In step 704 low-pass filtering with chopper stabilization is applied to remove unwanted portions of the signal 306 operating at the second operating frequency, thereby generating in step 706 a final filtered signal 203 at the second operating frequency. This embodiment can be employed in software, hardware and combinations thereof.

It should be evident from the numerous embodiments above that there are many ways to modify and/or add to these embodiments without changing the scope of the claims. It should also be recognized that the claims are intended to cover the structures described herein as performing the recited functions of method 700 and not only structural equivalents. The claims are sufficiently general to include equivalent structures.

For example, although a digital circuit and an analog circuit may not be structural equivalents in that a digital circuit employs discrete sampling techniques, while an analog circuit employs continuous sampling techniques, it is well known in the art that digital and analog circuit may be designed to be equivalent structures generating the same results. Similarly, algorithms used in digital processing may be emulated with analog designs. Accordingly, all equivalent modifications of the description above are intended to be included within the claimed scope as defined in the following claims.

What is claimed is:

1. A receiver, comprising:
   a down-conversion receiver for transforming a signal from a first operating frequency to a second operating frequency that is lower than the first operating frequency; and
   a receiver filter with chopper stabilization for filtering unwanted portions of the signal at the second operating frequency and for generating a final filtered signal at the second operating frequency, the receiver filter including at least one stage of an operational amplifier (OP AMP) with chopper stabilization coupled to a corresponding low-pass filter (LPF) network, and wherein the OP AMP generates from the signal at the second operating frequency an OP AMP signal at the second operating frequency that is filtered by the corresponding LPF network to generate the final filtered signal.

2. The receiver of claim 1, wherein the down-conversion receiver comprises a direct conversion receiver.

3. The receiver of claim 1, wherein the at least one OP AMP comprises:
   a reference oscillator
   an up-conversion mixer coupled to the reference oscillator for transforming the signal from the second operating frequency to a third operating frequency that is greater than the second operating frequency;
   an amplifier having at least one stage for generating from the signal at the third operating frequency an amplified signal at the third operating frequency; and
   a down-conversion mixer coupled to the reference oscillator for transforming the amplified signal from the third operating frequency to the OP AMP signal at the second operating frequency.

4. The receiver of claim 3, wherein the reference oscillator is among one of a group of clock signals comprising a periodic clock and a pseudo random clock with desirable spectral properties.

5. The receiver of claim 1, wherein the at least one OP AMP comprises:
   a reference oscillator;
   an up-conversion mixer coupled to the reference oscillator for transforming the signal from the second operating frequency to a third operating frequency that is greater than the second operating frequency;
   a first amplifier having at least one stage for generating from the signal at the third operating frequency a first amplified signal at the third operating frequency;
   a down-conversion mixer coupled to the reference oscillator for transforming the first amplified signal from the third operating frequency to the second operating frequency; and
   a second amplifier having at least one stage for transforming the first amplified signal at the second operating frequency to the OP AMP signal at the second operating frequency.

6. The receiver of claim 5, wherein the reference oscillator is among one of a group of clock signals comprising a periodic clock and a pseudo random clock with desirable spectral properties.

7. A receiver, comprising:
   a down-conversion receiver for transforming a signal from a first operating frequency to a second operating frequency that is lower than the first operating frequency; and
   a receiver filter with chopper stabilization for filtering unwanted portions of the signal at the second operating frequency and for generating a final filtered signal at the second overating frequency, wherein the receiver filter comprises:
   a reference oscillator;
   an up-conversion mixer coupled to the reference oscillator for transforming the signal from the second operating frequency to a third operating frequency that is greater than the second operating frequency;
   a bandpass filter amplifier having at least one stage for filtering unwanted portions of the signal around the third operating frequency and for generating an amplified filtered signal at the third operating frequency; and
   a down-conversion mixer coupled to the reference oscillator for transforming the amplified filtered signal from the third operating frequency to the final filtered signal at the second operating frequency.

8. The receiver of claim 7, wherein the reference oscillator is among one of a group of clock signals comprising a periodic clock and a pseudo random clock with desirable spectral properties.

9. The receiver of claim 7, wherein the receiver filter further comprises
a LPF having at least one stage for filtering unwanted portions of the amplified filtered signal at the second operating frequency and for generating the final filtered signal.

10. A selective call receiver, comprising:
a receiver for generating from a signal at a first operating frequency a final filtered signal at a second operating frequency that is lower than the first operating frequency; and
a processor for processing the final filtered signal;
wherein the receiver comprises:
   a down-conversion receiver for transforming the signal from the first operating frequency to the second operating frequency; and
   a receiver filter with chopper stabilization for filtering unwanted portions of the signal at the second operating frequency and for generating the final filtered signal at the second operating frequency the receiver filter including at least one stage of an operational amplifier (OP AMP) with chopper stabilization coupled to a corresponding low-pass filter (LPF) network, and wherein the OP AMP generates from the signal at the second operating frequency an OP AMP signal at the second operating frequency that is filtered by the corresponding LPF network to generate the final filtered signal.

11. The selective call receiver of claim 10, wherein the at least one Op AMP comprises;
a reference oscillator;
an up-conversion mixer coupled to the reference oscillator for transforming the signal from the second operating frequency to a third operating frequency that is greater than the second operating frequency;
an amplifier having at least one stage for generating from the signal at the third operating frequency an amplified signal at the third operating frequency; and
a down-conversion mixer coupled to the reference oscillator for transforming the amplified signal from the third operating frequency to the OP AMP signal at the second operating frequency.

12. The selective call receiver of claim 11, wherein the reference oscillator is among one of a group of clock signals comprising a periodic clock and a pseudo random clock with desirable spectral properties.

13. The selective call receiver of claim 10, wherein the at least one OP AMP comprises:
a reference oscillator,
an up-conversion mixer coupled to the reference oscillator for transforming the signal from the second operating frequency to a third operating frequency that is greater than the second operating frequency;
a first amplifier having at least one stage for generating from the signal at the third operating frequency a first amplified signal at the third operating frequency;
a down-conversion mixer coupled to the reference oscillator for transforming the first amplified signal from the third operating frequency to the second operating frequency; and
a second amplifier having at least one stage for transforming the first amplified signal at the second operating frequency to the OP AMP signal at the second operating frequency.

14. The selective call receiver of claim 13, wherein the reference oscillator is among one of a group of clock signals comprising a periodic clock and a pseudo random clock.

15. A selective call receiver, comprising:
a receiver for generating from a signal at a first operating frequency a final filtered signal at a second operating frequency that is lower than the first operating frequency; and
a processor for processing the final filtered signal;
wherein the receiver comprises:
   a down-conversion receiver for transforming the signal from the first operating frequency to the second operating frequency; and
   a receiver filter with chopper stabilization for filtering unwanted portions of the signal at the second operating frequency and for generating the final filtered signal at the second operation frequency, wherein the receiver filter comprises:
   a reference oscillator,
   an up-conversion mixer coupled to the reference oscillator for transforming the signal from the second operating frequency to a third operating frequency that is greater than the second operating frequency;
   a bandpass filter amplifier having at least one stage for filtering unwanted portions of the signal wound the third operating frequency and for generating an amplified filtered signal at the third operating frequency; and
   a down-conversion mixer coupled to the reference oscillator for transforming the amplified filtered signal from the third operating frequency to the final filtered signal at the second operating frequency.

16. The selective call receiver of claim 15, wherein the reference oscillator is among one of a group of clock signals comprising a periodic clock and a pseudo random clock with desirable spectral properties.

17. The selective call receiver of claim 15, wherein the receiver filter comprises:
a LPF having at least one stage for filtering unwanted portions of the amplified filtered signal at the second operating frequency and for generating the final filtered signal.

* * * * *